United States Patent [19]

Lidow et al.

[11] Patent Number: 5,008,725

[45] Date of Patent: Apr. 16, 1991

[54] PLURAL POLYGON SOURCE PATTERN FOR MOSFET

[75] Inventors: Alexander Lidow, Manhattan Beach; Thomas Herman, Redondo Beach; Vladimir Rumennik, El Segundo, all of Calif.

[73] Assignee: International Rectifier Corporation, El Segundo, Calif.

[21] Appl. No.: 291,423

[22] Filed: Dec. 23, 1988

Related U.S. Application Data

[63] Continuation of Ser. No. 243,544, Mar. 13, 1981, abandoned, which is a continuation of Ser. No. 38,662, May 14, 1979, abandoned.

[51] Int. Cl.$^5$ ............... H01L 29/100; H01L 29/780; H01L 29/060; H01L 27/100
[52] U.S. Cl. .................... 357/23.4; 357/20; 357/45
[58] Field of Search ............. 357/23 VD, 20, 45, 86, 357/23.4

[56] References Cited

U.S. PATENT DOCUMENTS

| | | | |
|---|---|---|---|
| 4,015,278 | 3/1977 | Fukuta | 357/23 VD |
| 4,072,975 | 2/1978 | Ishitani | 357/23 VD |
| 4,148,047 | 4/1979 | Hendrickson | 357/23 VD |

FOREIGN PATENT DOCUMENTS

| | | | |
|---|---|---|---|
| 0085381 | 7/1976 | Japan | 357/23 VD |
| 0000885 | 1/1979 | Japan | 357/23 VD |

*Primary Examiner*—Michael C. Wimer
*Assistant Examiner*—Peter Toby Brown
*Attorney, Agent, or Firm*—Ostrolenk, Faber, Gerb & Soffen

[57] ABSTRACT

A high power MOSFET has a plurality of closely packed polygonal sources spaced from one another on one surface of a semiconductor body. An elongated gate electrode is exposed in the spacing between the polygonal sources and cooperates with two channels, one for each adjacent source electrode, to control conduction from the source electrode through the channel and them to a drain electrode on the opposite surface of the semiconductor body. The conductive region adjacent the channel and between adjacent sources is relatively highly conductive in the section of the channel adjacent to the surface containing the sources. The polygonal shaped source members are preferably hexagonal so that the distances between adjacent sources is relatively constant throughout the device. Each polygonal region has a relatively deep central portion and a shallow outer shelf portion. The shelf portion generally underlies an annular source region. The deep central portion underlies an aluminum conductive electrode and is sufficiently deep that it will not be fully penetrated by aluminum spiking.

14 Claims, 3 Drawing Sheets

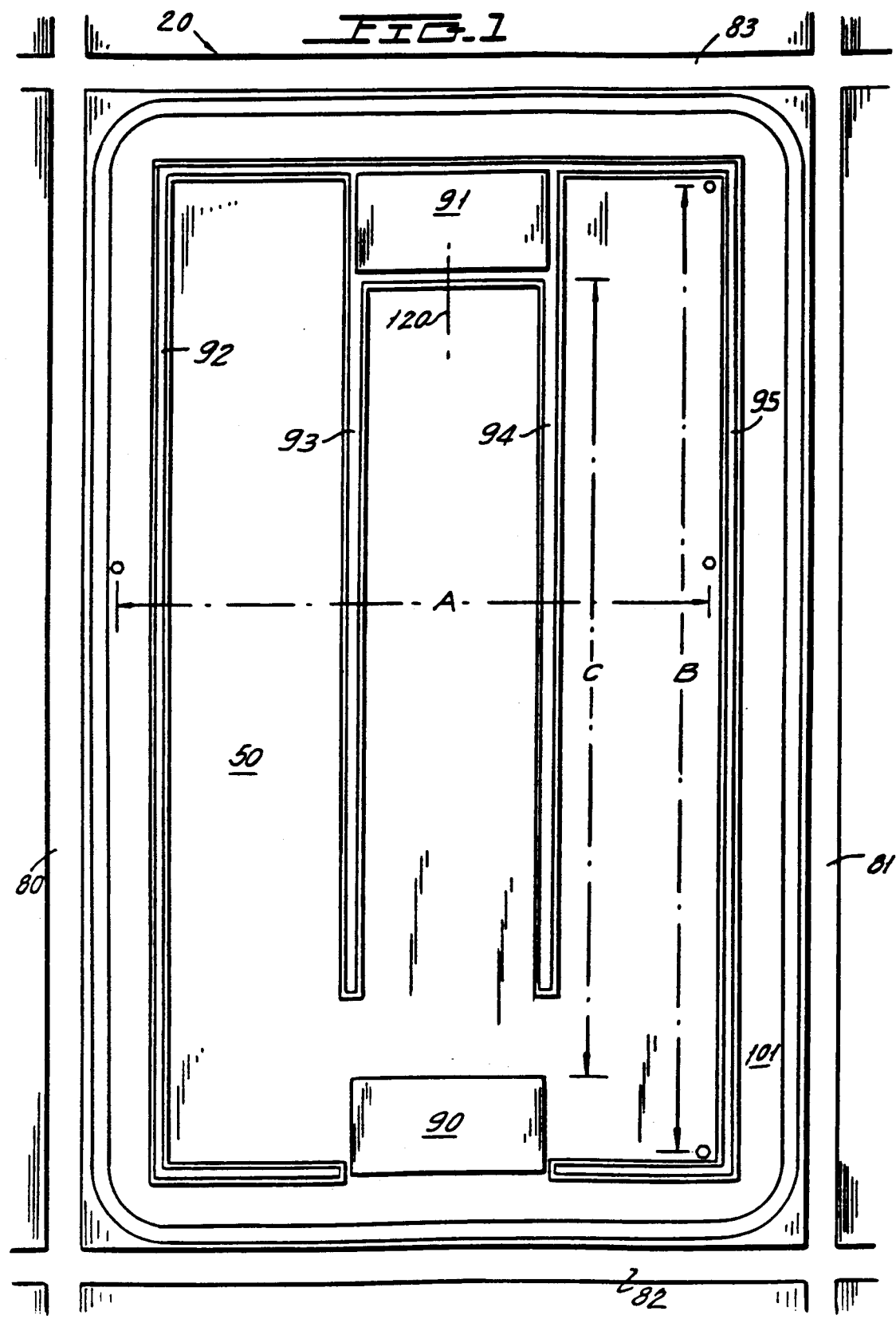

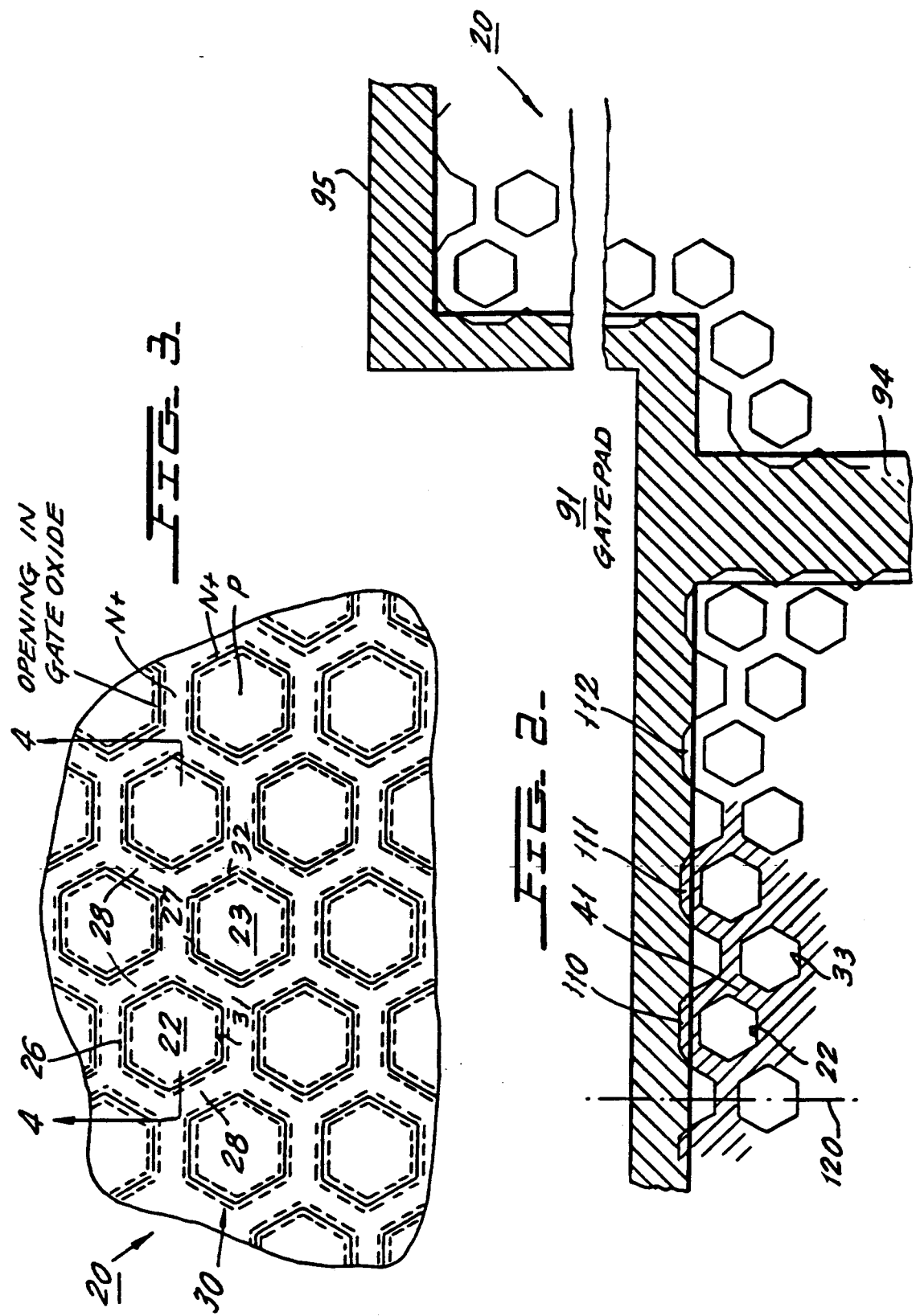

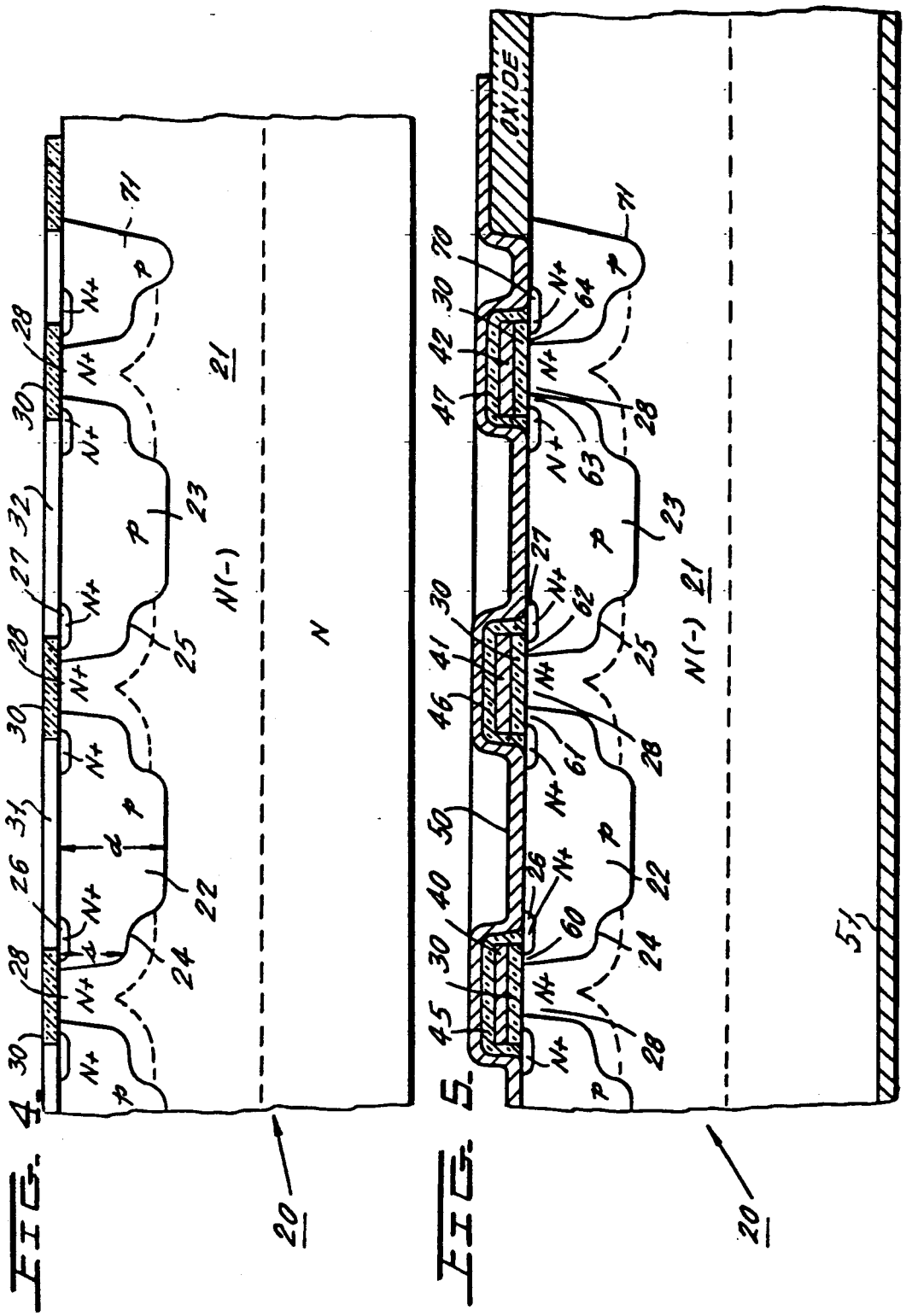

PLURAL POLYGON SOURCE PATTERN FOR MOSFET

This application is a continuation of application Ser. No. 243,544, filed Mar. 13, 1981, now abandoned, which was a continuation of application Ser. No. 038,662, filed May 14, 1979, now abandoned.

RELATED APPLICATIONS

This application is related to application Ser. No. 951,310, filed Oct. 13, 1978, now abandoned and refiled as continuation application Ser. No. 232,713, filed Feb. 9, 1981, now U.S. Pat. No. 4,376,286, entitled HIGH POWER MOSFET WITH LOW ON-RESISTANCE AND HIGH BREAKDOWN VOLTAGE, in the names of Alexander Lidow and Thomas Herman, and assigned to the assignee of the present invention.

BACKGROUND OF THE INVENTION

This invention relates to MOSFET devices, and more specifically relates to a novel source pattern for a MOSFET device of the type disclosed in above-mentioned U.S. Pat. No. 4,376,286 wherein a plurality of polygonal-shaped source elements are disposed over the surface of a semiconductor body and are spaced from one another by a closely controlled dimension.

High power MOSFETS having low on-resistance and high breakdown voltage are known and are shown in the above-noted U.S. Pat. No. 4,376,286. In the above application, the source electrodes are spaced, interdigitated source regions spaced from one another by two parallel channel regions covered by a common gate. The device has exceptionally low on-resistance along with the usual advantages of the MOSFET device over the bi-polar device particularly by virtue of a relatively high conductivity region disposed between the two adjacent channels and leading to a common drain electrode.

It has been found that an interdigitated structure has a relatively low packing density. Moreover, the interdigitated arrangement disclosed in the above U.S. Pat. No. 4,376,286 requires relatively complicated masks and has a relatively high capacitance.

BRIEF DESCRIPTION OF THE INVENTION

The present invention provides a novel high power MOSFET device with low forward resistance where a very high packing density is available and which can be made with relatively simple masks. The device further has relatively low capacitance. Typically, the device may be made through the use of phosphorus implantation and D-MOS fabrication techniques but any desired technique can be used.

Each of the individual spaced source regions, in accordance with the invention, is polygonal in configuration and is preferably hexagonal to ensure a constant spacing along the major lengths of the sources disposed over the surface of the body. An extremely large number of small hexagonal source elements may be formed in the same surface of the semiconductor body for a given device. By way of example, 6,600 hexagonal source regions can be formed in a chip area having a dimension of about 100 by 140 mils to produce an effective channel width of about 22,000 mils, thus permitting very high current capacity for the device.

The space between the adjacent sources may contain a polysilicon gate or any other gate structure where the gate structure is contacted over the surface of the device by elongated gate contact fingers which ensure good contact over the full surface of the device.

Each of the polygonal source regions is contacted by a uniform conductive layer which engages the individual polygonal sources through openings in an insulation layer covering the source regions, which openings can be formed by conventional D-MOS photolithographic techniques. A source pad connection region is then provided for the source conductor and a gate pad connection region is provided for the elongated gate fingers and a drain connection region is made to the reverse surface of the semiconductor device.

A plurality of such devices can be formed from a single semiconductor wafer and the individual elements can be separated from one another by scribing or any other suitable method.

BRIEF DESCRIPTION OF THE DRAWINGS

FIG. 1 is a plan view of a completed element on a semiconductor wafer prior to the separation of the element away from the remainder of the wafer.

FIG. 2 is an enlarged detail of the gate pad to illustrate the relationship of the gate contact and the source polygons in the region of the gate pad.

FIG. 3 is a detailed plan view of a small portion of the source region during one stage of the manufacturing process of the device.

FIG. 4 is a cross-sectional view of FIG. 3 taken across the section line 4—4 in FIG. 3.

FIG. 5 is similar to FIG. 4 and shows the addition of a polysilicon gate, a source electrode means and drain electrode to the wafer.

DETAILED DESCRIPTION OF THE DRAWINGS

The polygon configuration of the source regions of the present invention is best shown in FIGS. 3, 4 and 5 which are first described.

Referring first to FIGS. 3 and 4, the device is shown prior to the application of the gate, source and drain electrodes. The manufacturing process can be of any desired type. The manufacturing process described in U.S. Pat. No. 4,376,286, referred to above, which is incorporated herein by reference, can be used whereby D-MOS fabrication techniques and ion implantation techniques can be advantageously employed for the formation of the junction and placement of the electrode in the most advantageous way.

The device is described as an N channel enhancement type device. It will be apparent that the invention will also apply to P channel devices and to depletion mode devices.

The device of FIGS. 3 and 4 has a plurality of polygonal source regions on one surface of the device, where these polygonal regions are preferably hexagonal in shape. Other shapes such as squares could have been used but the hexagonal shape provides better uniformity of spacing between adjacent source region perimeters.

In FIGS. 3 and 4, the hexagonal source regions are formed in a basic semiconductor body or wafer which can be an N type wafer 20 of monocrystalline silicon which has a thin N-epitaxial region 21 deposited thereon as best shown in FIG. 4. All junctions are formed in epitaxial region 21. By using suitable masks, a plurality of P type base regions such as regions 22 and 23 in FIGS. 3 and 4 are formed in one surface of the semiconductor wafer region 21, where these regions are generally polygonal in configuration and, preferably, are hexagonal.

A very large number of such polygonal regions are formed. For example, in a device having a surface dimension of 100 by 140 mils, approximately 6600 polygonal regions are formed to produce a total channel width of about 22,000 mils. Each of the polygonal regions may have a width measured perpendicular to two opposing sides of the polygon of about 1 mil or less. The regions are spaced from one another by a distance of about 0.6 mil when measured perpendicularly between the adjacent straight sides of adjacent polygonal regions.

The P+ regions 22 and 23 will have a depth d which is preferably about 5 microns to produce a high and reliable field characteristic. Each of the P regions has an outer shelf region shown as shelf regions 24 and 25 for P regions 22 and 23, respectively, having a depth s of about 1.5 microns. This depth should be as small as possible to reduce the capacitance of the device.

Each of the polygon regions including polygonal regions 22 and 23 receive N+ polygonal ring regions 26 and 27, respectively. Shelves 24 and 25 are located beneath regions 26 and 27, respectively. N+ regions 26 and 27 cooperate with a relatively conductive N+ region 28 which is the N+ region disposed between adjacent P type polygons to define the various channels between the source regions and a drain contact which will be later described.

The highly conductive N+ regions 28 are formed in the manner described in U.S. Pat. No. 4,376,286, referred to above, and are the subject of that application and produce a very low forward resistance for the device.

In FIGS. 3 and 4, it will be noted that the entire surface of the wafer is covered with an oxide layer or combined conventional oxide and nitride layers which are produced for the formation of the various junctions. This layer is shown as the insulation layer 30. The insulation layer 30 is provided with polygonal shaped openings such as openings 31 and 32 immediately above polygonal regions 22 and 23. Openings 31 and 32 have boundaries overlying the N+ type source rings 26 and 27 for the regions 22 and 23, respectively. The oxide strips 30, which remain after the formation of the polygonal shaped openings, define the gate oxide for the device.

Electrodes may then be applied to the device as shown in FIG. 5. These include a polysilicon grid which includes polysilicon sections 40, 41 and 42 which overlie the oxide sections 30.

A silicon dioxide coating is then deposited atop the polysilicon grid 40 shown as coating sections 45, 46 and 47 in FIG. 5 which insulates the polysilicon control electrode and the source electrode which is subsequently deposited over the entire upper surface of the wafer. In FIG. 5 the source electrode is shown as conductive coating 50 which may be of any desired material, such as aluminum. A drain electrode 51 is also applied to the device.

The resulting device of FIG. 5 is an N channel type device wherein channel regions are formed between each of the individual sources and the body of the semiconductor material which ultimately leads to the drain electrode 51. Thus, a channel region 60 is formed between the source ring 26, which is connected to source electrode 50, and the N+ region 28 which ultimately leads to the drain electrode 51. Channel 60 is inverted to N type conductivity upon the application of a suitable control voltage to the gate 40. In a similar manner, channels 61 and 62 are formed between the source region 26, which is connected to the conductor 50, and the surrounding N+ region 28 which leads to the drain 51. Thus, upon application of a suitable control voltage to the polysilicon gate (including finger 41 in FIG. 5), channels 61 and 62 become conductive to permit majority carrier conduction from the source electrode 50 to the drain 51. Note that channels labeled 60 and 61 of FIG. 5 are the same annular channel which is formed within the region 22. Similarly, channels 62 and 63 are the same annular channel formed in the region 23.

Each of the sources form parallel conduction paths where, for example, channels 63 and 64 beneath gate element 42 permit conduction from the source ring 27 and an N type source strip 70 to the N+ region 28 and then to the drain electrode 51.

It is to be noted that FIGS. 4 and 5 illustrate an end P type region 71 which encloses the edge of the wafer.

The contact 50 of FIG. 5 is preferably an aluminum contact. It will be noted that the contact region for the contact 50 lies entirely over and in alignment with the deeper portion of the P type region 22. This is done since it was found that aluminum used for the electrode 50 might spike through very thin regions of the P type material. Thus, one feature of the present invention is to ensure that the contact 50 lies principally over the deeper portions of the P regions such as P regions 22 and 23. This then permits the active channel regions defined by the annular shelves 24 and 25 to be as thin as desired in order to substantially reduce the device capacitance.

FIG. 1 illustrates one completed device using the polygonal source pattern of FIG. 5. The completed device shown in FIG. 1 is contained within the scribe regions 80, 81, 82 and 83 which enable the breaking out of a plurality of unitary devices each having a dimension of 100 by 140 mils from the body of the wafer.

The polygonal regions described are contained in a plurality of columns and rows. By way of example, the dimension A contains 65 columns of polygonal regions and may be about 83 mils. The dimension B may contain 100 rows of polygonal regions and may be about 148 mils. Dimension C, which is disposed between a source connection pad 90 and a gate connection pad 91, may contain 82 rows of polygonal elements.

The source pad 90 is a relatively heavy metal section which is directly connected to the aluminum source electrode 50 and permits convenient lead connection for the source.

The gate connection pad 91 is electrically connected to a plurality of extending fingers 92, 93, 94 and 95 which extend symmetrically over the outer surface of the area containing the polygonal regions and make electrical connection to the polysilicon gate as will be described in connection with FIG. 2.

Finally the outer circumference of the device contains the P+ (shown as "P" in the drawings) deep diffusion ring 71 which may be connected to a field plate 101 shown in FIG. 1.

FIG. 2 shows a portion of the gate pad 91 and the gate fingers 94 and 95. It is desirable to make a plurality of contacts to the polysilicon gate in order to reduce the R-C delay constant of the device. The polysilicon gate has a plurality of regions including regions 110, 111, 112 and the like which extend outwardly and receive extensions of the gate pad and the gate pad elements 94 and 95. The polysilicon gate regions may be left exposed during the formation of the oxide coating 45-46-47 in FIG. 5 and are not coated by the source electrode 50. Note that in FIG. 2 the axis 120 is the axis of symmetry 120 which is that shown in FIG. 1.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A high power MOSFET device having more than 1000 parallel-connected individual FET devices closely packed into a relatively small area comprising:

a thin wafer of semiconductor material having first and second spaced, parallel planar surfaces; at least a first portion of the thickness of said wafer which extends from said first planar surface consisting of an epitaxially deposited region of a first conductivity type;

a plurality of symmetrically disposed laterally distributed hexagonal base regions each having a second conductivity type formed in said epitaxially deposited region and extending for a given depth beneath said first planar surface;

said hexagonal base regions spaced at said first surface from surrounding ones by a symmetric hexagonal lattice of semiconductor material of said first conductivity type;

each side of each of said hexagonal base regions being parallel to an adjacent side of another of said hexagonal base regions;

a hexagonal annular source region of said first conductivity type formed in an outer peripheral region of each of said hexagonal base regions and extending downwardly from said first planar surface to a depth less than the depth of said base regions;

an outer rim of each of said annular source regions being radially inwardly spaced from an outer periphery of its respective hexagonal base region to form an annular channel between each of said outer rims of said annular source regions and said symmetric hexagonal lattice of semiconductor material of said first portion of said wafer;

a common source electrode formed on said first planar surface and connected to a plurality of said annular source regions and to interiorly adjacent surface areas of their said respective hexagonal base regions;

a drain electrode connected to said second planar surface of said wafer;

an insulation layer means on said first planar surface and overlying at least said annular channels; and a polysilicon gate electrode atop said insulation layer means and operable to invert said annular channels.

2. The MOSFET device of claim 1, wherein the material of said lattice of said first conductivity type has a relatively high impurity concentration region compared to the concentration of the remainder of said first portion of said wafer; said relatively high concentration region having a depth greater than the depth of said source regions and less than the depths of said plurality of base regions.

3. A high power MOSFET device having more than 1000 parallel-connected individual FET devices closely packed into a relatively small area comprising:

a thin wafer of semiconductor material having first and second spaced, parallel planar surfaces; at least a first portion of the thickness of said wafer which extends from said first planar surface consisting of an epitaxially deposited region of a first conductivity type;

a plurality of symmetrically disposed laterally distributed polygonal base regions each having a second conductivity type formed in said lightly doped region and extending for given depth beneath said first planar semiconductor surface;

said polygonal base regions spaced at said first surface from surrounding ones by a symmetric polygonal lattice of semiconductor material of said first conductivity type;

each side of each of said polygonal base regions being parallel to an adjacent side of another of said polygonal base regions;

a polygonal annular source region of said first conductivity type formed in an outer peripheral region of each of said polygonal base regions and extending downwardly from said first planar surface to a depth less than the depth of said base regions;

an outer rim of each of said annular source regions being radially inwardly spaced from an outer periphery of its respective polygonal base region to form an annular channel between each of said outer rims of said annular source regions and said symmetric polygonal lattice of semiconductor material of said first portion of said wafer;

a common source electrode formed on said first planar surface and connected to a plurality of said annular source regions and to interiorly adjacent surface areas of their said respective polygonal base regions;

a drain electrode connected to said second planar semiconductor surface of said wafer;

an insulation layer means on said first planar surface and overlying at least said annular channels; and a polysilicon gate electrode atop said insulation layer means and operable to invert said annular channels.

4. The MOSFET device of claim 1 or 3, wherein each of said base regions occupies a total lateral area having a diameter less than about 1 mil and are spaced from adjacent base regions by about 0.6 mil.

5. The device of claim 1 or 3, wherein said 40M, is an N type conductivity, said base regions are a P type conductivity and said source regions are an N type conductivity.

6. The MOSFET device of claim 3, wherein the material of said lattice of said first conductivity type has a relatively high impurity concentration region compared to the concentration of the remainder of said first portion of said wafer; said relatively high concentration region having a depth greater than the depth of said source regions and less than the depths of said plurality of base regions.

7. A vertical conduction high power MOSFET device exhibiting relatively low on-resistance and relatively high breakdown voltage; said device comprising:

a wafer of semiconductor material having planar first and second opposing semiconductor surfaces; said wafer of semiconductor material having a relatively lightly doped major body portion for receiving junctions and being doped with impurities of a first conductivity type;

a plurality of highly packed, equally spaced symmetrically disposed identical polygonal base regions of a second conductivity type formed in said wafer, each extending from said first planar semiconductor surface to a first depth beneath said first planar semiconductor surface; said polygonal base regions spaced from surrounding ones by a symmetric polygonal lattice of semiconductor material of said first conductivity type; the space between adjacent ones of said polygonal base regions defining a common conduction region of said first conductivity type extending downwardly from said first planar semiconductor surface;

a respective polygonal annular source region of said first conductivity type formed within each of said polygonal base regions and extending downwardly from said first planar semiconductor surface to a depth less than said first depth; each of said polygonal annular source regions being laterally spaced along said first planar semiconductor surface from the facing respective edges of said common conduction region thereby to define respective coplanar annular channel regions along said first planar semiconductor surface between the polygonal sides of each of said polygonal annular source regions and said common conduction region;

a common source electrode means connected to said polygonal annular source regions and their respective base regions;

gate insulation layer means on said first planar semiconductor surface, disposed at least on said coplanar channel regions;

gate electrode means on said gate insulation layer means and overlying said coplanar channel regions;

a drain conductive region remote from said common conduction region and separated therefrom by said relatively lightly doped major body portion and extending to said second semiconductor surface; and a drain electrode coupled to said drain conductive region.

8. A high power MOSFET device exhibiting relatively low on-resistance and relatively high breakdown voltage; said device comprising:

a wafer of semiconductor material having planar first and second opposing semiconductor surfaces; said wafer of semiconductor material having a relatively lightly doped major body portion for receiving junctions and being doped with impurities of a first conductivity type;

at least first and second spaced base regions of a second conductivity type formed in said wafer and extending downwardly from said first planar semiconductor surface to a first depth beneath said first planar semiconductor surface; the space between said at least first and second spaced base regions defining a common conduction region of a first conductivity type at a given first planar semiconductor surface location; said common conduction region extending downwardly from said first planar semiconductor surface;

first and second annular source regions of said first conductivity type formed in said first and second spaced base regions respectively at said first planar semiconductor surface locations to a depth less than said first depth; said first and second annular source regions being laterally spaced along said first planar semiconductor surface from the facing respective edges of said common conduction region thereby to define first and second channel regions along said first planar semiconductor surface between each pair of said first and second annular source regions, respectively, and said common conduction region; each of said first and second channel regions being coplanar with one another;

a common source electrode means connected to said first and second annular source regions and their respective first and second base regions;

gate insulation layer means on said first planar semiconductor surface, disposed at least on said first and second channel regions;

gate electrode means on said gate insulation layer means and overlying said first and second channel regions;

a drain conductive region remote from said common conduction region and separated therefrom by said relatively lightly doped major body portion and extending to said second semiconductor surface;

a drain electrode coupled to said drain conductive region; and each of said at least first and second spaced base regions having a polygonal configuration; each of said first and second annular source regions having a polygonal configuration conforming to that of their respective base region.

9. The MOSFET device of claims 7 or 8 wherein said common conduction region is relatively highly doped, compared to said relatively lightly doped major body portion and extends downwardly from said first planar semiconductor surface to a depth greater than the depth of said source regions, whereby resistance to current flow at the boundaries between said channel regions and said common conduction region and between said common conduction region and said relatively lightly doped major body portion is reduced without reducing breakdown voltage.

10. The MOSFET device of claim 9, wherein the depth of said common conduction region is less than said first depth of said base regions.

11. The MOSFET device of claim 1, 3, 35 or 36, wherein each of said base regions has a deepened central region and a shallower outer peripheral region, said deepened central region extending laterally under only a portion of its associated source region.

12. The MOSFET device of claim 11, wherein said deepened central region has a depth of approximately 5 microns and said shallower outer peripheral region has a depth of greater than approximately 1.5 microns.

13. The device of claim 32, 35 or 36, wherein there are in excess of about 1000 source regions each having a width of about 1 mil.

14. The device of claim 7 or 8, wherein said lightly doped wafer portion is an N type conductivity, said base regions are a P type conductivity and said source regions are an N type conductivity.

* * * * *

UNITED STATES PATENT AND TRADEMARK OFFICE
CERTIFICATE OF CORRECTION

PATENT NO. : 5,008,725
DATED : April 16, 1991
INVENTOR(S) : Alexander Lidow et al It is certified that error appears in the above-identified patent and that said Letters Patent is hereby corrected as shown below:

On the title page item [57]:

Abstract line 8, change "them" to -- then --.

Column 6, line 44, change "40M," to -- epitaxially deposited region --.

Column 8, line 46, change "35 or 36" to -- 7 or 8 --.

line 55, change "32, 35 or 36" to -- 3, 7 or 8 --.

Signed and Sealed this

Fifth Day of May, 1992

Attest:

DOUGLAS B. COMER

Attesting Officer

Acting Commissioner of Patents and Trademarks

REEXAMINATION CERTIFICATE (1900th)

United States Patent [19]

Lidow et al.

[11] B1 5,008,725

[45] Certificate Issued  Jan. 12, 1993

[54] PLURAL POLYGON SOURCE PATTERN FOR MOSFET

[76] Inventors: Alexander Lidow, Manhattan Beach; Thomas Herman, Redondo Beach; Vladimir Rumennik, El Segundo, all of Calif.

Reexamination Request:
No. 90/002,478, Oct. 9, 1991

Reexamination Certificate for:
Patent No.: 5,008,725
Issued: Apr. 16, 1991
Appl. No.: 291,423
Filed: Dec. 23, 1988

Certificate of Correction issued May 5, 1992.

Related U.S. Application Data

[63] Continuation of Ser. No. 243,544, Mar. 13, 1981, abandoned, which is a continuation of Ser. No. 38,662, May 14, 1979, abandoned.

[51] Int. Cl.$^5$ .................. H01L 29/10; H01L 29/78; H01L 29/68
[52] U.S. Cl. .................. 257/335; 257/341; 257/776
[58] Field of Search ............... 357/23.4, 23.8

[56] References Cited

U.S. PATENT DOCUMENTS

| | | | |
|---|---|---|---|
| 4,015,278 | 3/1977 | Fukuta | 357/22 |
| 4,028,717 | 6/1977 | Joy et al. | 357/23.8 |
| 4,072,975 | 2/1978 | Ishitani | 357/23.4 |
| 4,078,947 | 3/1978 | Johnson et al. | 357/23.4 |
| 4,145,700 | 3/1979 | Jambotkar | 357/23 |
| 4,145,703 | 3/1979 | Blanchard | 357/55 |
| 4,959,699 | 9/1990 | Lidow et al. | 357/23.7 |
| 5,047,820 | 9/1991 | Garnett | 357/23.8 |

FOREIGN PATENT DOCUMENTS

| | | | |
|---|---|---|---|
| 51-85381 | 7/1976 | Japan | |
| 52-106688 | 9/1977 | Japan | 29/78 |
| 54-885 | 1/1979 | Japan | 357/23.4 |

OTHER PUBLICATIONS

Yoshida et al., "A High Power MOSFET With A Vertical Drain Electrode And A Meshed Gate Structure," *IEEE Journal of Solid-State Circuits*, vol. SC-11, No. 4, Aug. 1976, pp. 472-477.

Hayashi et al., "DNA MOS Transistor And Its Integrated Circuit," Proceedings of the Eighth Conference on Solid State Devices, *Japanese Journal of Applied Physics*, vol. 16, pp. 163-166 (1976).

Tarui et al., "Diffusion Self-aligned MOST: A New Approach for High Speed Device," Proceedings of the First Conference on Solid State Devices, *Journal of the Japan Society of Applied Physics*, vol. 39, pp. 105-110 (1969).

Nagata, "Power Handling Capability of MOSFET," *Japanese Journal of Applied Physics*, vol. 16 (1977), Supplement 16-1, pp. 217-222.

Rexer Declaration Executed 16 Jan. 1991.
Rexer Declaration Executed 14 Jun. 1991.
Neilson Declaration Executed 16 Jan. 1991.
Neilson Declaration Executed 14 Jun. 1991.

J. Sansbury, "Applications of Ion Implantation in Semiconductor Processing", *Solid State Technology* (Nov. 1976), pp. 31-37.

J. L. Stone et al., "Recent Advances in Ion Implantation—A State of the Art Review", *Solid State Technology* (Jun. 1976) pp. 35-44.

R. J. Duchynski, "Ion Implantation for Semiconductor Devices", *Solid State Technology* (Nov. 1977) pp. 53-58.

Overviews of Sessions 6, 12, 18 and 29, *Technical Digest, International Electron Devices Meeting* (Dec. 1989).

*Primary Examiner*—J. Carroll

[57] ABSTRACT

A high power MOSFET has a plurality of closely packed polygonal sources spaced from one another on one surface of a semiconductor body. An elongated gate electrode is exposed in the spacing between the polygonal sources and cooperates with two channels, one for each adjacent source electrode, to control conduction from the source electrode through the channel and then to a drain electrode on the opposite surface of the semiconductor body. The conductive region adjacent the channel and between adjacent sources is relatively highly conductive in the section of the channel adjacent to the surface containing the sources. The polygonal shaped source members are preferably hexagonal so that the distances between adjacent sources is relatively constant throughout the device. Each polygonal region has a relatively deep central portion and a shallow outer shelf portion. The shelf portion generally underlies an annular source region. The deep central portion underlies an aluminum conductive electrode and is sufficiently deep that it will not be fully penetrated by aluminum spiking.

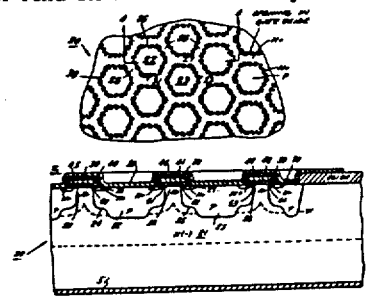

B1 5,008,725

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OR REEXAMINATION, IT HAS BEEN DETERMINED THAT:

Claims 1, 3, 7 and 8 are determined to be patentable as amended.

Claims 2, 4 to 6, and 9 to 14, dependent on an amended claim, are determined to be patentable.

1. A high power MOSFET device having more than 1000 parallel-connected individual FET devices closely packed into a relatively small area comprising:
   a thin wafer of semiconductor material having first and second spaced, parallel planar surfaces; at least a first portion of the thickness of said wafer which extends from said first planar surface consisting of an epitaxially deposited region of a first conductivity type;
   a plurality of symmetrically disposed laterally distributed *identical* hexagonal base regions each having a second conductivity type formed in said epitaxially deposited region and extending for a given depth beneath said first planar surface;
   said hexagonal base regions spaced at said first surface from surrounding ones by a symmetric hexagonal lattice of semiconductor material of said first conductivity type;
   *said lattice being continuous and uninterrupted;*
   each side of each of said hexagonal base regions being parallel to an adjacent side of another of said hexagonal base regions;
   a hexagonal annular source region of said first conductivity type formed in an outer peripheral region of each of said hexagonal base regions and extending downwardly from said first planar surface to a depth less than the depth of said base regions;
   an outer rim of each of said annular source regions being radially inwardly spaced from an outer periphery of its respective hexagonal base region to form an annular channel between each of said outer rims of said annular source regions and said symmetric hexagonal lattice of semiconductor material of said first portion of said wafer;
   a common source electrode formed on said first planar surface and connected to a plurality of said annular source regions and to interiorly adjacent surface areas of their said respective hexagonal base regions;
   a drain electrode connected to said second planar surface of said wafer;
   an insulation layer means on said first planar surface and overlying at least said annular channels; and
   a polysilicon gate electrode atop said insulation layer means and operable to invert said annular channels.

3. A high power MOSFET device having more than 1000 parallel-connected individual FET devices closely packed into a relatively small area comprising:
   a thin wafer of semiconductor material having first and second spaced, parallel planar surfaces; at least a first portion of the thickness of said wafer which extends from said first planar surface consisting of an epitaxially deposited region of a first conductivity type;
   a plurality of symmetrically disposed laterally distributed *identical* polygonal base regions each having a second conductivity type formed in said lightly doped region and extending for given depth beneath said first planar semiconductor surface;
   said polygonal base regions spaced at said first surface from surrounding ones by a symmetric polygonal lattice of semiconductor material of said first conductivity type;
   *said lattice being continuous and uninterrupted;*
   each side of each of said polygonal base regions being parallel to an adjacent side of another of said polygonal base regions;
   a polygonal annular source region of said first conductivity type formed in an outer peripheral region of each of said polygonal base regions and extending downwardly from said first planar surface to a depth less than the depth of said base regions;
   an outer rim of each of said annular source regions being radially inwardly spaced from an outer periphery of its respective polygonal base region to form an annular channel between each of said outer rims of said annular source regions and said symmetric polygonal lattice of semiconductor material of said first portion of said wafer;
   a common source electrode formed on said first planar surface and connected to a plurality of said annular source regions and to interiorly adjacent surface areas of their said respective polygonal base regions;
   a drain electrode connected to said second planar semiconductor surface of said wafer;
   an insulation layer means on said first planar surface and overlying at least said annular channels; and
   a polysilicon gate electrode atop said insulation layer means and operable to invert said annular channels.

7. A vertical conduction high power MOSFET device exhibiting relatively low on-resistance and relatively high breakdown voltage; said device comprising:
   a wafer of semiconductor material having planar first and second opposing semiconductor surfaces; said wafer of semiconductor material having a relatively lightly doped major body portion for receiving junctions and being doped with impurities of a first conductivity type;
   a plurality of highly packed, equally spaced symmetrically disposed identical polygonal base regions of a second conductivity type formed in said wafer, each extending from said first planar semiconductor surface to a first depth beneath said first planar semiconductor surface; said polygonal base regions spaced from surrounding ones by a symmetric polygonal lattice of semiconductor material of said first conductivity type;
   *said lattice being continuous and uninterrupted;* the space between adjacent ones of said polygonal base regions defining a commonconduction region of said first conductivity type extending downwardly from said first planar semiconductor surface;

a respective polygonal annular source region of said first conductivity type formed within each of said polygonal base regions and extending downwardly from said first planar semiconductor surface to a depth less than said first depth; each of said polygonal annular source regions being laterally spaced along said first planar semiconductor surface from the facing respective edges of said common conduction region thereby to define respective coplanar annular channel regions along said first planar semiconductor surface between the polygonal sides of each of said polygonal annular source regions and said common conduction region;

a common source electrode means connected to said polygonal annular source regions and their respective base regions;

gate insulation layer means on said first planar semiconductor surface, disposed at least on said coplanar channel regions;

gate electrode means on said gate insulation layer means and overlying said coplanar channel regions;

a drain conductive region remote from said common conduction region and separated therefrom by said relatively lightly doped major body portion and extending to said second semiconductor surface; and a drain electrode coupled to said drain conductive region.

8. A high power MOSFET device exhibiting relatively low on-resistance and relatively high breakdown voltage; said device comprising:

a wafer of semiconductor material having planar first and second opposing semiconductor surfaces; said wafer of semiconductor material having a relatively lightly doped major body portion for receiving junctions and being doped with impurities of a first conductivity type;

at least first and second spaced base regions of a second conductivity type formed in said wafer and extending downwardly from said first planar semiconductor surface to a first depth beneath said first planar semiconductor surface; the space between said at least first and second spaced base regions defining a common conduction region of a first conductivity type at a given first planar semiconductor surface location; said common conduction region extending downwardly from said first planar semiconductor surface;

*the surface of said common conduction region being continuous and uninterrupted and of said first conductivity type;* first and second annular source regions of said first conductivity type formed in said first and second spaced base regions respectively at said first planar semiconductor surface locations to a depth less than said first depth; said first and second annular source regions being laterally spaced along said first planar semiconductor surface from the facing respective edges of said common conduction region thereby to define first and second channel regions along said first planar semiconductor surface between each pair of said first and second annular source regions, respectively, and said common conduction region; each of said first and second channel regions being coplanar with one another;

a common source electrode means connected to said first and second annular source regions and their respective first and second base regions;

gate insulation layer means on said first planar semiconductor surface, disposed at least on said first and second channel regions;

gate electrode means on said gate insulation layer means and overlying said first and second channel regions;

a drain conductive region remote from said common conduction region and separated therefrom by said relatively lightly doped major body portion and extending to said second semiconductor surface;

a drain electrode coupled to said drain conductive region; and each of said at least first and second spaced base regions having [a polygonal configuration] *identical polygonal configurations*; each of said first and second annular source regions having a polygonal configuration conforming to that of their respective base region.

* * * * *

(12) REEXAMINATION CERTIFICATE (4332nd)
United States Patent
Lidow et al.

(10) Number: US 5,008,725 C2
(45) Certificate Issued: May 1, 2001

(54) PLURAL POLYGON SOURCE PATTERN FOR MOSFET

(75) Inventors: Alexander Lidow, Manhattan Beach; Thomas Herman, Redondo Beach; Vladimir Rumennik, El Segundo, all of CA (US)

(73) Assignee: International Rectifier Corporation, El Segundo, CA (US)

Reexamination Requests:
No. 90/003,495, Jul. 15, 1994
No. 90/003,805, Apr. 25, 1995
No. 90/004,429, Oct. 21, 1996

Reexamination Certificate for:
Patent No.: 5,008,725
Issued: Apr. 16, 1991
Appl. No.: 07/291,423
Filed: Dec. 23, 1988

Reexamination Certificate B1 5,008,725 issued Jan. 12, 1993

Certificate of Correction issued May 5, 1992.

Related U.S. Application Data

(63) Continuation of application No. 06/243,544, filed on Mar. 13, 1981, now abandoned, which is a continuation of application No. 06/038,662, filed on May 14, 1979, now abandoned.

(51) Int. Cl.$^7$ .................................................. H01L 29/76
(52) U.S. Cl. .......................................... 257/341; 257/343
(58) Field of Search .............................. 357/23 VD, 20, 357/45, 86, 23.4

(56) References Cited

U.S. PATENT DOCUMENTS

| | | | |
|---|---|---|---|
| 4,015,278 | 3/1977 | Fukuta | .................................. 357/22 |
| 4,057,844 | * 11/1977 | Smedley | .............................. 361/111 |

(List continued on next page.)

FOREIGN PATENT DOCUMENTS

| | | |
|---|---|---|
| 51-85381 | 7/1976 | (JP) . |
| 51-134076 | 11/1976 | (JP) . |
| 52-104878 | 9/1977 | (JP) . |
| 54-885 | 1/1979 | (JP) . |

OTHER PUBLICATIONS

Fred P. Heiman, "MOS Field–Effect Transistors" in: *Field–Effect Transistors, Physics, Technology and Applications*, Ed. by J. Torkel Wallmark and Harwick Johnson, Prentice–Hall, Englewood Cliffs, New Jersey (1966) pp. 187, 189.*

(List continued on next page.)

*Primary Examiner*—J. Carroll

(57) ABSTRACT

A high power MOSFET has a plurality of closely packed polygonal sources spaced from one another on one surface of a semiconductor body. An elongated gate electrode is exposed in the spacing between the polygonal sources and cooperates with two channels, one for each adjacent source electrode, to control conduction from the source electrode through the channel and then to a drain electrode on the opposite surface of the semiconductor body. The conductive region adjacent the channel and between adjacent sources is relatively highly conductive in the section of the channel adjacent to the surface containing the sources. The polygonal shaped source members are preferably hexagonal so that the distances between adjacent sources is relatively constant throughout the device. Each polygonal region has a relatively deep central portion and a shallow outer shelf portion. The shelf portion generally underlies an annular source region. The deep central portion underlies an aluminum conductive electrode and is sufficiently deep that it will not be fully penetrated by aluminum spiking.

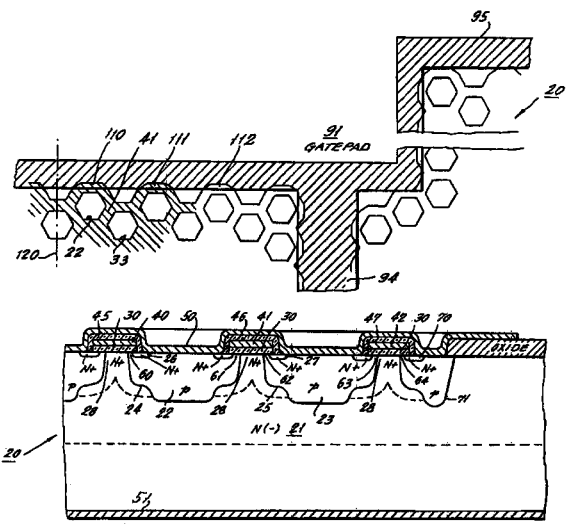

U.S. PATENT DOCUMENTS

| | | | |
|---|---|---|---|
| 4,072,975 | 2/1978 | Ishitani | 357/23 |
| 4,145,700 | 3/1979 | Jambotkar | 357/23 |
| 4,145,703 | 3/1979 | Blanchard et al. | 357/55 |
| 4,148,047 | 4/1979 | Hendrickson | 357/23 |
| 4,376,286 | 3/1983 | Lidow et al. | 357/23 |
| 4,599,576 | 7/1986 | Yoshida et al. | 330/264 |
| 4,642,666 | 2/1987 | Lidow et al. | 357/23.4 |
| 4,705,759 | 11/1987 | Lidow et al. | 437/29 |
| 4,735,914 | 4/1988 | Hendrickson et al. | 437/44 |
| 4,959,699 | 9/1990 | Lidow et al. | 357/23.7 |

OTHER PUBLICATIONS

"MOSFET power soars to 60W with currents up to 2A," *Electronic Design,* vol. 21 (Oct. 11, 1975) pp. 103–104.*

Tarui et al., "Diffusion Self–Aligned MOST: A New Approach for High Speed Device," *J. of Japan Society of Applied Physics,* vol. 39, 1970, pp. 105–110.

Yoshida et al., "A High power MOSFET with a Vertical Drain Electrode and a Meshed Gate Structure," *IEEE Journal of Solid–State Circuits,* vol. SC–11, No. 4, Aug. 1976, pp. 472–477.

Kirshna, "Second Breakdown in High Voltage MOS Transistors," *Solid–State Electronics,* vol. 20, 1977, pp. 875–878.

Lisiak, et al., "Optimization of Nonplanar Power MOS Transistors," *IEEE Transactions on Electron Devices,* vol. ED–25, No. 10, Oct. 1978, pp. 1229–1234.

* cited by examiner

REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–14 is confirmed.

New claims 15–52 are added and determined to be patentable.

15. *A high power MOSFET device having more than 1000 parallel-connected individual FET devices closely packed into a relatively small area comprising:*

*a thin wafer of semiconductor material having first and second spaced, parallel planar surfaces; at least a first portion of the thickness of said wafer which extends from said first planar surface consisting of an epitaxially deposited region of a first conductivity type;*

*a plurality of equally spaced symmetrically disposed laterally distributed identical hexagonal base regions each having a second conductivity type formed in said epitaxially deposited region and extending for a given depth beneath said first planar surface, the space between said hexagonal base regions defining a vertical common conduction region of said first conductivity type extending downwardly from said first planar surface;*

*said hexagonal base regions spaced at said first surface from surrounding ones by a symmetric hexagonal lattice of semiconductor material of said first conductivity type;*

*said lattice being continuous and uninterrupted;*

*each side of each of said hexagonal base regions being parallel to an adjacent side of another of said hexagonal base regions;*

*a hexagonal annular source region of said first conductivity type formed in an outer peripheral region of each of said hexagonal base regions and extending downwardly from said first planar surface to a depth less than the depth of said base regions;*

*an outer rim of each of said annular source regions being radially inwardly spaced from an outer periphery of its respective hexagonal base region to form an annular channel between each of said outer rims of said annular source regions and said symmetric hexagonal lattice of semiconductor material of said first portion of said wafer;*

*a common source electrode formed on said first planar surface and connected to a plurality of said annular source regions and to interiorly adjacent surface areas of their said respective hexagonal base regions;*

*a drain electrode connected to said second planar surface of said wafer;*

*an insulation layer means on said first planar surface and overlying at least said annular channels; and*

*a polysilicon gate electrode atop said insulation layer means and operable to invert said annular channels.*

16. *The device of claim 15 wherein said vertical common conduction region is disposed beneath said insulation layer means on said first surface.*

17. *A high power MOSFET device having more than 1000 parallel-connected individual FET devices closely packed into a relatively small area comprising:*

*a thin wafer of semiconductor material having first and second spaced, parallel planar surfaces; at least a first portion of the thickness of said wafer which extends from said first planar surface consisting of an epitaxially deposited region of a first conductivity type;*

*a plurality of equally spaced symmetrically disposed laterally distributed identical polygonal base regions each having a second conductivity type formed in said epitaxially deposited region and extending for a given depth beneath said first planar semiconductor surface, the space between said polygonal base regions defining a vertical common conduction region of said first conductivity type extending downwardly from said first planar surface;*

*said polygonal base regions spaced at said first surface from surrounding ones by a symmetric polygonal lattice of semiconductor material of said first conductivity type;*

*said lattice being continuous and uninterrupted;*

*each side of each of said polygonal base regions being parallel to an adjacent side of another of said polygonal base regions;*

*a polygonal annular source region of said first conductivity type formed in an outer peripheral region of each of said polygonal base regions and extending downwardly from said first planar surface to a depth less than the depth of said base regions;*

*an outer rim of each of said annular source regions being radially inwardly spaced from an outer periphery of its respective polygonal base region to form an annular channel between each of said outer rims of said annular source regions and said symmetric polygonal lattice of semiconductor material of said first portion of said wafer;*

*a common source electrode formed on said first planar surface and connected to a plurality of said annular source regions and to interiorly adjacent surface areas of their said respective polygonal base regions;*

*a drain electrode connected to said second planar semiconductor surface of said wafer;*

*an insulation layer means on said first planar surface and overlying at least said annular channels; and*

*a polysilicon gate electrode atop said insulation layer means and operable to invert said annular channels.*

18. *The device of claim 17 wherein said vertical common conduction region is disposed beneath said insulation layer means on said first surface.*

19. *The device of claim 7 wherein said drain electrode is connected to said second semiconductor surface.*

20. *The device of claim 8 wherein said drain electrode is connected to said second semiconductor surface.*

21. *A vertical conduction high power MOSFET device exhibiting relatively low on-resistance and relatively high breakdown voltage; said device comprising:*

*a wafer of semiconductor material having planar first and second opposing semiconductor surfaces; said wafer of semiconductor material having a relatively lightly doped major body portion for receiving junctions and being doped with impurities of a first conductivity type;* a plurality of highly packed, equally spaced symmetrically disposed identical polygonal base regions of a second conductivity type formed in said wafer, each extending from said first planar semiconductor surface to a first depth beneath said first planar semiconductor surface; said polygonal base regions spaced from surrounding ones by a symmetric polygonal lattice of semiconductor material of said first conductivity type;

said lattice being continuous and uninterrupted; the space between adjacent ones of said polygonal base regions defining a vertical common conduction region of said first conductivity type extending downwardly from said first planar semiconductor surface;

a respective polygonal annular source region of said first conductivity type formed within each of said polygonal base regions and extending downwardly from said first planar semiconductor surface to a depth less than said first depth; each of said polygonal annular source regions being laterally spaced along said first planar semiconductor surface from the facing respective edges of said common conduction region thereby to define respective coplanar annular channel regions along said first planar semiconductor surface between the polygonal sides of each of said polygonal annular source regions and said common conduction region;

a common source electrode means connected to said polygonal annular source regions and their respective base regions;

gate insulation layer means on said first planar semiconductor surface, disposed at least on said coplanar channel regions;

gate electrode means on said gate insulation layer means and overlying said coplanar channel regions;

a drain conductive region remote from said common conduction region and separated therefrom by said relatively lightly doped major body portion and extending to said second semiconductor surface; and a drain electrode coupled to said drain conductive region.

22. The device of claim 21 wherein said vertical common conduction region is disposed beneath said gate insulation layer means on said first surface.

23. The device of claim 21 wherein said drain electrode is connected to said second semiconductor surface.

24. A high power MOSFET device exhibiting relatively low on-resistance and relatively high breakdown voltage; said device comprising:

a wafer of semiconductor material having planar first and second opposing semiconductor surfaces; said wafer of semiconductor material having a relatively lightly doped major body portion for receiving junctions and being doped with impurities of a first conductivity type;

at least first and second spaced base regions of a second conductivity type formed in said wafer and extending downwardly from said first planar semiconductor surface to a first depth beneath said first planar semiconductor surface; the space between said at least first and second spaced base regions defining a vertical common conduction region of a first conductivity type at a given first planar semiconductor surface location; said common conduction region extending downwardly from said first planar semiconductor surface;

the surface of said common conduction region being continuous and uninterrupted and of said first conductivity type;

first and second annular source regions of said first conductivity type formed in said first and second spaced base regions respectively at said first planar semiconductor surface locations to a depth less than said first depth; said first and second annular source regions being laterally spaced along said first planar semiconductor surface from the facing respective edges of said common conduction region thereby to define first and second channel regions along said first planar semiconductor surface between each pair of said first and second annular source regions, respectively, and said common conduction region; each of said first and second channel regions being coplanar with one another;

a common source electrode means connected to said first and second annular source regions and their respective first and second base regions;

gate insulation layer means on said first planar semiconductor surface, disposed at least on said first and second channel regions;

gate electrode means on said gate insulation layer means and overlying said first and second channel regions;

a drain conductive region remote from said common conduction region and separate therefrom by said relatively lightly doped major body portion and extending to said second semiconductor surface;

a drain electrode coupled to said drain conductive region; and each of said at least first and second spaced base regions having identical polygonal configurations; each of said first and second annular source regions having a polygonal configuration conforming to that of their respective base region.

25. The device of claim 24 wherein said vertical common conduction region is disposed beneath said gate insulation layer means on said first surface.

26. The device of claim 24 wherein said drain electrode is connected to said second semiconductor surface.

27. The device of claim 1, wherein each of said annular channels has a hexagonal shape with a plurality of sides, at least one of the sides of each of said annular channels being in longitudinal alignment with at least one of the sides of at least one other of said annular channels, and wherein said polysilicon gate electrode is electrically connected to at least one finger extending from a gate connection pad, said finger extending and contacting said polysilicon gate electrode along a line defined by the longitudinal alignment of at least one of the sides of at least one of said annular channels with at least one of the sides of at least one other of said annular channels.

28. The device of claim 15, wherein each of said annular channels has a hexagonal shape with a plurality of sides, at least one of the sides of each of said annular channels being in longitudinal alignment with at least one of the sides of at least one other of said annular channels, and wherein said polysilicon gate electrode is electrically connected to at least one finger extending from a gate connection pad, said finger extending and contacting said polysilicon gate electrode along a line defined by the longitudinal alignment of at least one of the sides of at least one of said annular channels with at least one of the sides of at least one other of said annular channels.

29. The device of claim 3, wherein each of said annular channels has a polygonal shape with a plurality of sides, at least one of the sides of each of said annular channels being in longitudinal alignment with at least one of the sides of at least one other of said annular channels, and wherein said polysilicon gate electrode is electrically connected to at least one finger extending from a gate connection pad, said finger extending and contacting said polysilicon gate electrode along a line defined by the longitudinal alignment of at least one of the sides of at least one of said annular channels with at least one of the sides of at least one other of said annular channels.

30. The device of claim 17, wherein each of said annular channels has a polygonal shape with a plurality of sides, at least one of the sides of each of said annular channels being in longitudinal alignment with at least one of the sides of at least one other of said annular channels, and wherein said polysilicon gate electrode is electrically connected to at least one finger extending from a gate connection pad, said finger extending and contacting said polysilicon gate electrode along a line defined by the longitudinal alignment of at least one of the sides of at least one of said annular channels with at least one of the sides of at least one other of said annular channels.

31. The device of claim 7, wherein each of said annular channels has a polygonal shape with a plurality of sides, at least one of the sides of each of said annular channels being in longitudinal alignment with at least one of the sides of at least one other of said annular channels, and wherein said gate electrode means is electrically connected to at least one finger extending from a gate connection pad, said finger extending and contacting said gate electrode means along a line defined by the longitudinal alignment of at least one of the sides of at least one of said annular channel regions with at least one of the sides of at least one other of said annular channel regions.

32. The device of claim 21, wherein each of said annular channels has a polygonal shape with a plurality of sides, at least one of the sides of each of said annular channels being in longitudinal alignment with at least one of the sides of at least one other of said annular channels, and wherein said gate electrode means is electrically connected to at least one finger extending from a gate connection pad, said finger extending and contacting said gate electrode means along a line defined by the longitudinal alignment of at least one of the sides of at least one of said annular channel regions with at least one of the sides of at least one other of said annular channel regions.

33. The device of claim 8, wherein each of said channel regions has a polygonal shape with a plurality of sides, at least one of the sides of each of said annular channels being in longitudinal alignment with at least one of the sides of at least one other of said channel regions, and wherein said gate electrode means is electrically connected to at least one finger extending from a gate connection pad, said finger extending and contacting said gate electrode means along a line defined by the longitudinal alignment of at least one of the sides of at least one of said channel regions with at least one of the sides of at least one other of said channel regions.

34. The device of claim 24, wherein each of said channel regions has a polygonal shape with a plurality of sides, at least one of the sides of each of said channel regions being in longitudinal alignment with at least one of the sides of at least one other of said channel regions, and wherein said gate electrode means is electrically connected to at least one finger extending from a gate connection pad, said finger extending and contacting said gate electrode means along a line defined by the longitudinal alignment of at least one of the sides of at least one of said channel regions with at least one of the sides of at least one other of said channel regions.

35. The device of claim 1, wherein said polysilicon gate electrode is electrically connected to at least one finger extending from a gate connection pad, said at least one finger extending between a plurality of said base regions.

36. The device of claim 15, wherein said polysilicon gate electrode is electrically connected to at least one finger extending from a gate connection pad, said at least one finger extending between a plurality of said base regions.

37. The device of claim 3, wherein said polysilicon gate electrode is electrically connected to at least one finger extending from a gate connection pad, said at least one finger extending between a plurality of said base regions.

38. The device of claim 17, wherein said polysilicon gate electrode is electrically connected to at least one finger extending from a gate connection pad, said at least one finger extending between a plurality of said base regions.

39. The device of claim 7, wherein said gate electrode means is electrically connected to at least one finger extending from a gate connection pad, said at least one finger extending between a plurality of said base regions.

40. The device of claim 21, wherein said gate electrode means is electrically connected to at least one finger extending from a gate connection pad, said at least one finger extending between a plurality of said base regions.

41. The device of claim 8, wherein said gate electrode means is electrically connected to at least one finger extending from a gate connection pad, said at least one finger extending between a plurality of said base regions.

42. The device of claim 24, wherein said gate electrode means is electrically connected to at least one finger extending from a gate connection pad, said at least one finger extending between a plurality of said base regions.

43. The device of claim 1, wherein said lattice of semiconductor material has a shape at said first surface, and at least a portion of said polysilicon gate electrode conforms to the shape at said first surface of said lattice of semiconductor material; said polysilicon gate electrode being electrically connected to at least one finger extending from a gate connection pad; said at least one finger contacting at least a portion of said portion of said polysilicon gate electrode.

44. The device of claim 15, wherein said lattice of semiconductor material has a shape at said first surface, and wherein at least a portion of said polysilicon gate electrode conforms to the shape at said first surface of said lattice of semiconductor material; said polysilicon gate electrode being electrically connected to at least one finger extending from a gate connection pad; said at least one finger contacting at least a portion of said portion of said polysilicon gate electrode.

45. The device of claim 3, wherein said lattice of semiconductor material has a shape at said first planar surface, and wherein at least a portion of said polysilicon gate electrode conforms to the shape at said first planar surface of said lattice of semiconductor material; said polysilicon gate electrode being electrically connected to at least one finger extending from a gate connection pad; said at least one finger contacting at least a portion of said portion of said polysilicon gate electrode.

46. The device of claim 17, wherein said lattice of semiconductor material has a shape at said first planar surface, and wherein at least a portion of said polysilicon gate electrode conforms to the shape at said first planar surface of said lattice of semiconductor material; said polysilicon gate electrode being electrically connected to at least one finger extending from a gate connection pad; said at least one finger contacting at least a portion of said portion of said polysilicon gate electrode.

47. The device of claim 7, wherein said lattice of semiconductor material has a shape at said first planar semiconductor surface, and wherein at least a portion of said gate electrode means conforms to the shape at said first planar semiconductor surface of said lattice of semiconductor material; said gate electrode means being electrically connected to at least one finger extending from a gate connection pad; said at least one finger contacting at least a portion of said portion of said gate electrode means.

48. The device of claim 21, wherein said lattice of semiconductor material has a shape at said first planar semiconductor surface, and wherein at least a portion of said gate electrode means conforms to the shape at said first planar semiconductor surface of said lattice of semiconductor material; said gate electrode means being electrically connected to at least one finger extending from a gate connection pad; said at least one finger contacting at least a portion of said portion of said gate electrode means.

49. The device of claim 7, wherein said common conduction region has a shape at said first planar semiconductor surface, and wherein at least a portion of said gate electrode means conforms to the shape at said first planar semiconductor surface of said common conduction region; said gate electrode means being electrically connected to at least one finger extending from a gate connection pad; said at least one finger contacting at least a portion of said portion of said gate electrode means.

50. The device of claim 21, wherein said vertical common conduction region has a shape at said first planar semiconductor surface, and wherein at least a portion of said gate electrode means conforms to the shape at said first planar semiconductor surface of said vertical common conduction region; said gate electrode means being electrically connected to at least one finger extending from a gate connection pad; said at least one finger contacting at least a portion of said portion of said gate electrode means.

51. The device of claim 8, wherein said common conduction region has a shape at said first planar semiconductor surface, and wherein at least a portion of said gate electrode means conforms to the shape at said first planar semiconductor surface of said common conduction region; said gate electrode means being electrically connected to at least one finger extending from a gate connection pad; said at least one finger contacting at least a portion of said portion of said gate electrode means.

52. The device of claim 24, wherein said vertical common conduction region has a shape at said first planar semiconductor surface, and wherein at least a portion of said gate electrode means conforms to the shape at said first planar semiconductor surface of said vertical common conduction region; said gate electrode means being electrically connected to at least one finger extending from a gate connection pad; said at least one finger contacting at least a portion of said portion of said gate electrode means.

* * * * *